US006877132B1

(12) United States Patent
De et al.

(10) Patent No.: US 6,877,132 B1
(45) Date of Patent: Apr. 5, 2005

(54) METHOD AND APPARATUS FOR CHANNEL DECODING OF TAIL-BITING CONVOLUTIONAL CODES (75) Inventors: Aloknath A. De, Verdun (CA); Yan Hui, Nepean (CA)

(73) Assignee: Nortel Network Limited, St. Laurent (CA)

(*) Notice: Subject to any disclaimer, the term of this patent is extended or adjusted under 35 U.S.C. 154(b) by 0 days.

(21) Appl. No.: 09/330,182

(22) Filed: Jun. 11, 1999

(51) Int. Cl.[7] .............................................. H03M 13/41
(52) U.S. Cl. ..................................................... 714/795
(58) Field of Search ........................................ 714/795

(56) References Cited

U.S. PATENT DOCUMENTS

| | | | |
|---|---|---|---|
| 5,349,589 A | 9/1994 | Chennakeshu et al. | ....... 371/43 |
| 5,355,376 A | 10/1994 | Cox et al. | ....... 371/43 |
| 5,369,671 A | 11/1994 | Yehushua et al. | ....... 375/94 |
| 5,416,787 A | * 5/1995 | Kodama et al. | ....... 371/43 |
| 5,721,746 A | 2/1998 | Hladik et al. | ....... 371/43 |

OTHER PUBLICATIONS

H.H. Ma and J.K. Wolf, "On Tail Biting Convolutional Codes", IEEE Transactions on Communications., vol. COM–34, No. 2, pp. 104–111, Feb. 1986.
Q. Wang and V.K. Bhargava, "An Efficient Maximum Likelihood Decoding Algorithm for Generalized Tail Biting Convolutional Codes Including Quasicyclic Codes", IEEE Transactions on Communications., vol. 37, No. 8, pp. 875–879, Aug. 1989.
R.V. Cox and C–E.W. Sundberg, "An Efficient Adaptive Circular Viterbi Algorithm for Decoding Generalized Tail-biting Convolutional Codes", IEEE Transactions on Vehicular Technology, vol. 43, No. 1, pp. 57–68, Feb. 1994.

Lin, S., Costello, D.J., "Error Control Coding: Fundamentals and Applications", Englewood Cliffs, NJ: Prentice–Hall, 1983.
J.B. Anderson and K. Balachandran, "Decision Depths of Convolutional Codes", IEEE Transactions on Information Theory, vol. 35, No. 2, pp. 455–459, Mar. 1989.
Interim Specification 130 (IS–130A), International Telecommunication Union.
Haccoun, D. and Begin, G., "High–Rate Punctured Convolutional Codes for Viterbi and Sequential Decoding", IEEE Transactions on Communications, vol. 37, No. 11, pp. 1113–1125, 1989.
Hagenauer, J., Seshadri, N., and Sundberg, C–E.W., "The Performance of Rate–Compatible Punctured Convolutional Codes for Digital Mobile Radio", IEEE Transactions on Communications, vol. 38, No. 7, pp. 966–980, Jul. 1990.
"Cellular System Dual–Mode Mobile Station—Base Station Compatibility Standard (IS–136A)", Cellular Telecommunications Industry Association.
GPRS—136 Standard, 1998.

* cited by examiner

Primary Examiner—Stephen M. Baker (57) ABSTRACT

A method for hard-decision channel decoding of tail-biting convolutional codes includes the step of receiving from a channel an input bit stream encoded by a tail-biting convolutional channel encoder. The encoder includes a number of memory elements and a rate. The input bit stream includes a series of symbols; each symbol includes a number of bits; the number of bits is related to the rate of the encoder. The method further includes the step of assuming a probability for each possible initial state of the encoder. The method further includes the step of decoding each symbol of the input bit stream using majority logic, with reference to a trellis structure corresponding to the encoder. The trellis structure represents: a number of states related to the number of memory elements of the encoder; a plurality of transitional branches; and a number of stages related to the number of symbols in the input bit stream.

21 Claims, 8 Drawing Sheets

Fig. 1

PRIOR ART

METHOD AND APPARATUS FOR CHANNEL DECODING OF TAIL-BITING CONVOLUTIONAL CODES

FIELD OF THE INVENTION

The present invention relates generally to forward error correction, and more particularly to a method and apparatus for decoding of tail-biting convolutional codes.

BACKGROUND OF THE INVENTION

A communication channel is the medium between a transmitter and a receiver. The medium may introduce noise, interference or other channel errors. Any medium that may inject errors will be referred to as a channel. The medium may be a storage medium or a communication medium. The purpose of channel encoding and decoding is to assist in protecting against channel errors, which occur in situations such as where there is noise, fading, multipath and interference, when signal transmission or reception is in an elevator, in a moving car, amidst tall buildings, in hilly terrain, or the like.

Channel encoding techniques typically involve the addition of redundant bits to the input bit stream to assist in error detection and correction. Channel encoding, which is generally standardized, includes two main techniques: block encoding and convolutional encoding. The present invention is relevant to convolutional encoding.

Figure 1:
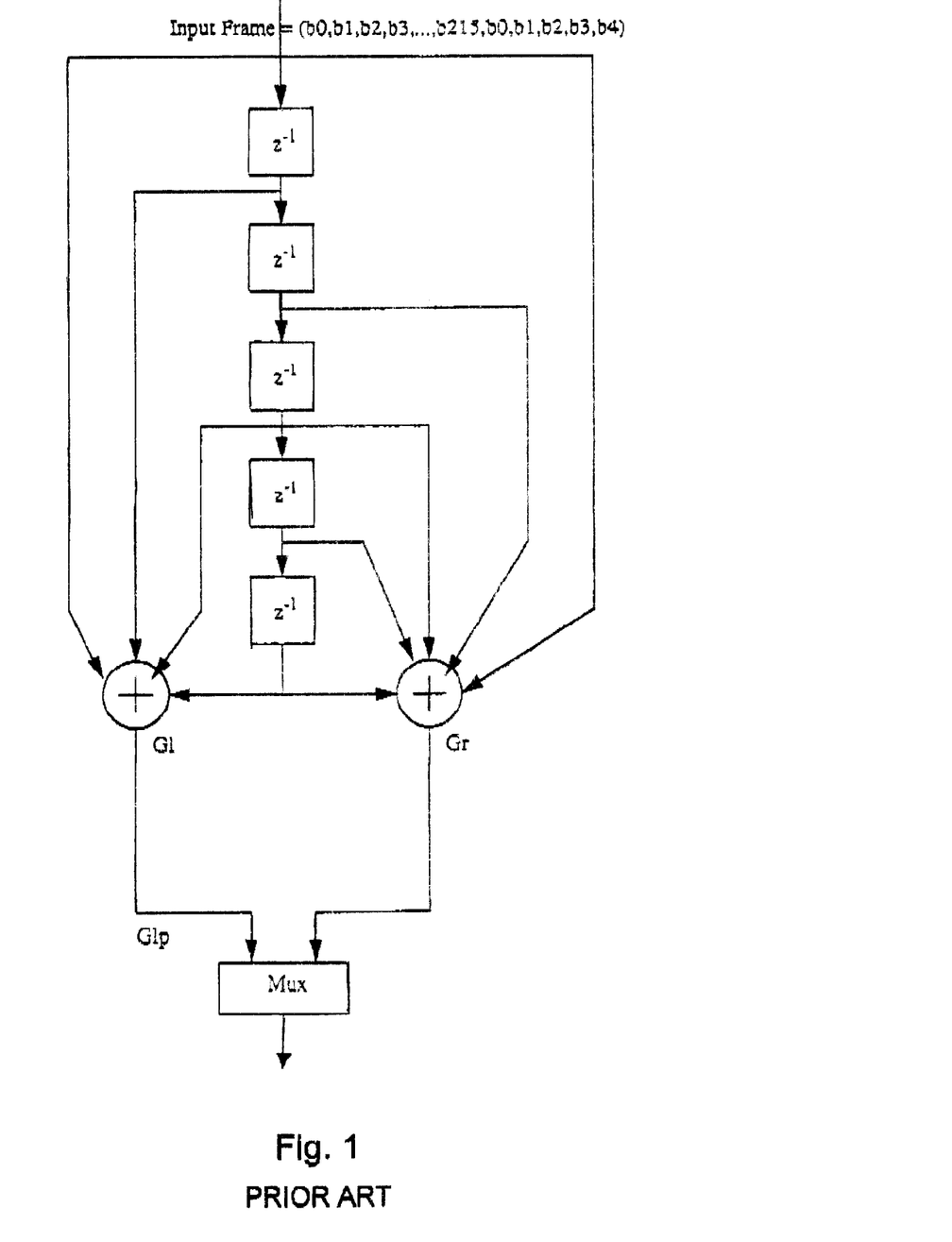
FIG. 1 is a diagram of a prior art rate-1/2 tail-biting convolutional channel encoder.

Convolutional codes differ from block codes in that the encoder contains memory and the "n" encoder outputs at any given time unit rely not only on the "k" inputs at that time unit, but also on "m" previous input blocks. An (n, k, m) convolutional code can be realized with a k-input n-output linear sequential circuit, with "m" memory elements. Convolutional codes have been used extensively in digital communications in order to improve error performance and thereby protect the source information better [Lin, S., Costello, D. J., "Error Control Coding: Fundamentals and Applications", Englewood Cliffs, N.J.: Prentice-Hall, 1983]. The channel encoder illustrated in FIG. 1 is a convolutional encoder, comprising an input carrying input frames connected to five memory elements 110, which are connect to the inputs of two XOR gates 112, 114 whose outputs are in turn connected to a multiplexor (MUX) 130 whose output is the encoded frame. An (n,k,m) convolutional encoder has $2^m$ states and a rate k/n. The convolutional encoder with m=5 of FIG. 1 has $2^5$ or 32 probable states. Such a rate-1/2 convolutional encoder generates a symbol with two (2) output bits for each input bit. A rate-1/3 convolutional encoder outputs three (3) bits for every input bit, and so on. While it is important to add redundant bits to facilitate error detection and correction, transmission of the redundant bits consumes additional bandwidth. It is therefore important in a given application to use a convolutional encoder with as high a rate as possible while maintaining an acceptable error tolerance for the application.

More sophisticated convolutional encoders generally have more memory, and therefore more states, than less sophisticated ones. The more states a convolutional encoder has, the higher will be the complexity of the decoding process. As the convolutional encoder with m=5 of FIG. 1 has thirty-two (32) states, the decoding process will have fairly high complexity. For a convolutional encoder with seven (7) memory elements, the complexity of the decoding process would be even higher.

In a convolutional encoder, each input bit must travel through each memory element in order for the number of output bits generated by the convolutional encoder to correspond to the number of input bits and the rate of the convolutional encoder. One method of convolutional encoding is to use tail bits to flush the convolutional encoder by initializing each memory element with a zero (0). In other words, the convolutional encoder is forced to reset to the all 0 state by passing through it a string of 0's of length equal to the memory of the convolutional encoder. The input bit stream is increased in length by the number of tail bits. Thus, for the convolutional encoder with m=5 of FIG. 1, five (5) 0's would be added at the end of the input bit stream in order for all input bits to pass through all memory elements 110. Note that the tail bits do not have to be all 0's. They could be all ones (1's), or a known combination of 0's and 1's. What is important is that the values of the tail bits are known at the decoder.

Tail bits are important for ensuring that each input bit passes through each memory element of the convolutional encoder. Furthermore, the decoding process is made easier by virtue of the fact that the initial state, e.g. all 0's, of the encoder is known. However, tail bits use additional bandwidth, since the tail bits must also be passed through the encoder to process each input frame. Thus, a rate-1/2 convolutional encoder will output 270 bits for an input frame consisting of 130 input bits, since 130 input bits plus 5 tail bits must be processed.

In order to conserve bandwidth, it is desirable to reduce the number of output bits generated by a convolutional encoder. To this end, the concepts of tail-biting and puncturing may be applied.

Tail-biting typically involves initializing the m encoder memory elements with the first m input bits in the input bit stream. The first m input bits are also copied to the end of the input bit stream and processed again by the convolutional encoder. Thus, with respect to the convolutional encoder of FIG. 1, input bits b0, b1, b2, b3 and b4 are used for initializing the encoder memory and also are circulated back to the end of the bit stream. Alternatively, the last input bits in the input bit stream may be used to initialize the convolutional encoder and then the entire input bit stream is passed through the encoder to form the output bit stream. In a further alternative, bits from both the beginning and end of the input bit stream may be used to initialize the convolutional encoder. Tail biting codes may be conceived as circular convolutional codes. Thus, any subset of the input bit stream could be used for initializing, the memory elements (with reference to FIG. 1, this would be five (5) memory elements 110), as long as all the bits thereafter pass through the memory elements in a cyclic fashion.

Puncturing derives a higher rate convolutional code from a lower rate convolutional encoder, so that the output bit stream is shorter in length compared to the output bit stream produced without any puncturing. This helps obtain sufficient coding gain without occupying as much bandwidth. In a punctured tail-biting code, the number of symbols in the extension bits used for tail-biting typically corresponds to a whole number of puncture periods. However, at the extension boundary, the puncture period may not be completed. For example, in the above scenario, Glp43, Gr215 form the 216-th symbol (which is non-punctured). The next symbol (after extension) will be Glp0, Gr0, which happens to be non-punctured also. While computing the decoding metric, this needs to be taken into account.

Tail-biting convolutional codes may be low rate (e.g., rate-1/2) or high rate (e.g., rate-5/6). As indicated above, low rate convolutional codes have more redundancy than high rate convolutional codes. High rate convolutional codes may be generated directly or by puncturing a low rate convolutional code. High rate punctured tail-biting convolutional codes are desirable in certain applications. While they have less error detection and correction capability compared to the low rate convolutional code from which they are derived, due to reduced redundancy in the output of the convolutional encoder, they provide higher data rate and are capable of providing, when used in conjunction with Automatic Repeat Request (ARQ) protocol, lower frame error rate (FER).

Figure 2:
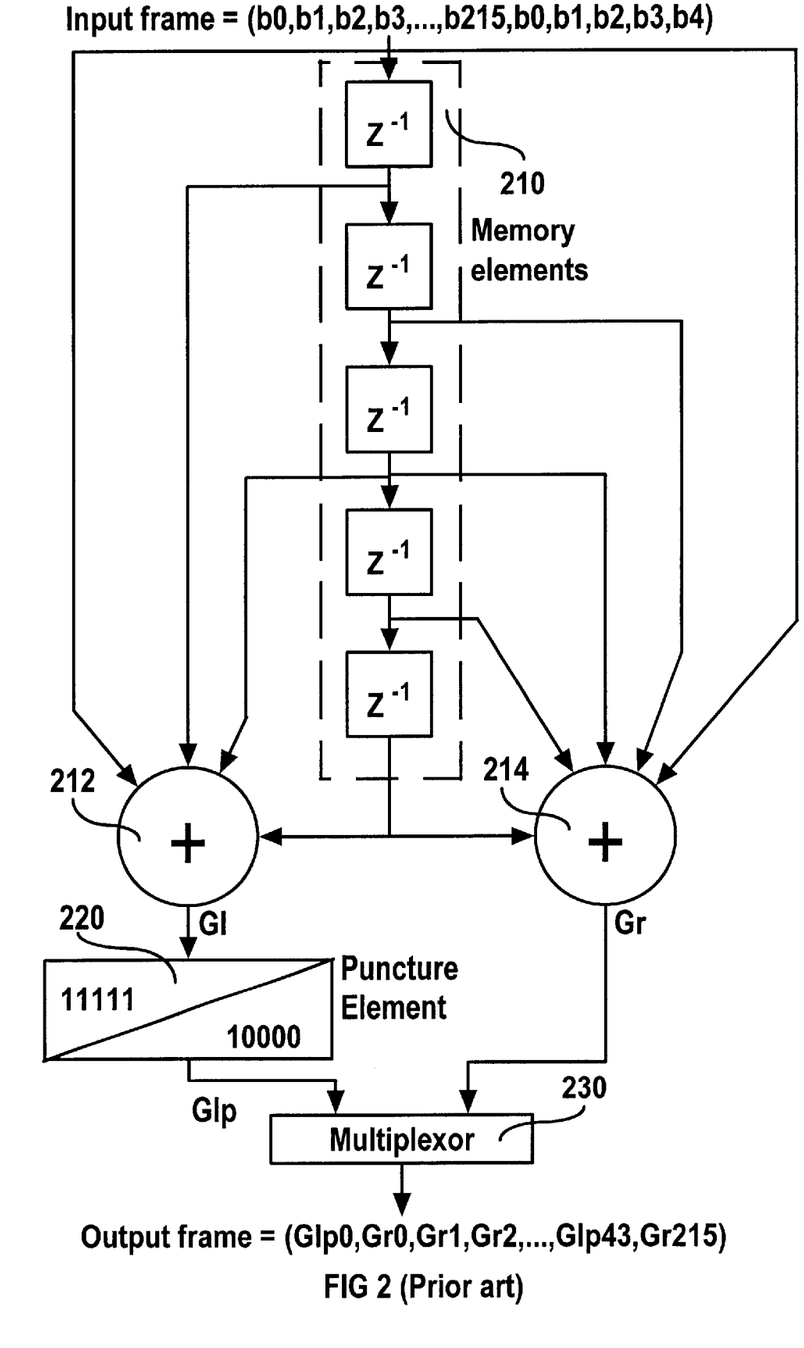
FIG. 2 is a diagram of a prior art rate-5/6 tail-biting convolutional channel encoder with puncturing.

FIG. 2 illustrates a tail-biting rate-5/6 convolutional channel encoder. This tail-biting coding arrangement initializes the memory 210 with the first five (5) input bits, which are circulated again at the end of the input bit stream. A puncture element 220 derives a rate-5/6 convolutional code from rate-1/2 bit streams Gl and Gr. All bits from output stream Gr are transmitted to a multiplexer (MUX) 230, while only every fifth bit from output stream Gl is transmitted to the MUX 230. Thus, for an input bit stream b of (b0, b1, b2, . . . ), bit streams Gl of (Gl0, Gl1, Gl2, . . . ) and Gr of (Gr0, Gr1, Gr2, . . . ) are generated. Puncture element 220 then generates a bit stream Glp of (Gl0, Gl5, Gl10, . . . ), and MUX 230 generates a bit stream Go of (Glp0, Gr0, Gr1, Gr2, Gr3, Gr4, Glp1, Gr5, Gr6, . . . ). Thus, for every five (5) input bits, only one additional bit is added by the rate-5/6 convolutional encoder compared to five (5) bits added by a rate-1/2 encoder. The reduced error correcting ability of the convolutional code associated with puncturing may be sufficient for an application, may be offset by other forward error correction techniques, and may be compensated for in other ways, such as by defining more states.

Decoding tail-biting convolutional code is significantly more complex than decoding non-tail-biting convolutional code. Although the encoding polynomials are known to the decoder, the initial state of the convolutional encoder is unknown. Sophisticated techniques must therefore be employed by the decoder to estimate the input bit stream from the bit stream received over the channel.

Figure 3:
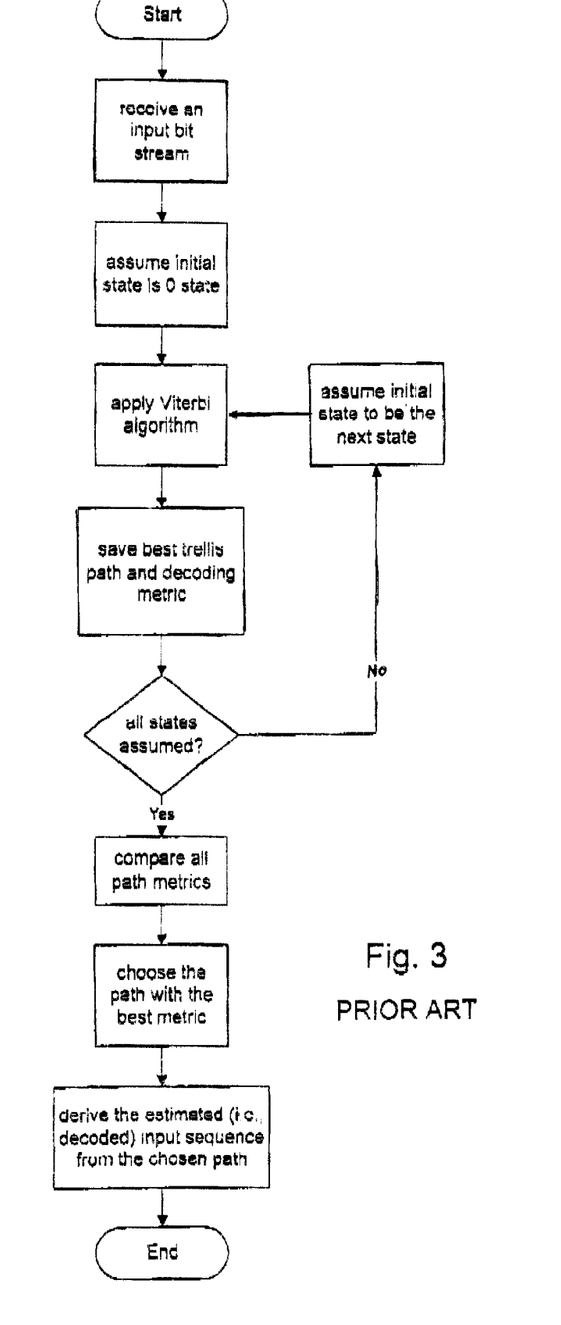
FIG. 3 is a flowchart of a prior art optimal channel decoding scheme for tail biting convolutional codes.

The Viterbi algorithm is typically used to decode non-tail-biting codes [H. H. Ma and J. K. Wolf, "On Tail Biting Convolutional Codes", IEEE Transactions on Communications, Vol. COM-34, No. 2, pp. 104–111, February 1986; Q. Wang and V. K. Bhargava, "An Efficient Maximum Likelihood Decoding Algorithm for Generalized Tail Biting Convolutional Codes Including Quasicyclic Codes", IEEE Transactions on Communications., Vol. 37, No. 8, pp. 875–879, August 1989; S. Chennakeshu and R. L. Toy, "Generalized Viterbi Algorithm with Tail-Biting", U.S. Pat. No. 5,349,589, Issue Date: Sep. 20, 1994]. Note that the Viterbi algorithm is equally applicable to punctured code, provided that the deleted bit pattern is taken into account by the decoding scheme while computing the decoding metric or depuncturing is done before the decoding. For non-tail-biting codes, the Viterbi algorithm has the luxury of assuming that the encoder was in state 0 when the first information was transmitted. With tail-biting codes, this is no longer the case. In fact, for arbitrary data input, the encoder may have started in any of the possible states. FIG. 3 illustrates a simple (but high-complexity) decoding scheme for tail-biting codes could be as follows [H. H. Ma and J. K. Wolf, "On Tail Biting Convolutional Codes", IEEE Transaction on Communications, Vol. COM-34, No. 2, pp. 104–111, February 1986]:

Receive 305 an input bit stream

Step 1: Assume 310 that the starting state of the encoder was 0.

Step 2: Apply 315 the Viterbi algorithm as usual.

Step 3: Save 320 both the best-trellis-path, and its decoding metric score from Step 2.

Step 4: Assume that the starting state of the encoder was 1, then repeat Steps 2 and 3.

Step 5: Repeat Steps 2 and 3 with all of the remaining states as initial state.

Step 6: Of all paths and scores collected from the runs above, pick the path 335 which had the best decoding metric score 340. The input sequence derived from this path 345 will always be the most likely input.

The algorithm of FIG. 3 provides an optimal solution, but may be unacceptably slow for many applications. This scheme is unsuitable for real-time application as the code processing complexity is always $2^M$ times that of its non-tail-biting counterpart, where M is the number of memory elements in the encoder [R. V. Cox and C-E. W. Sundberg, "An Efficient Adaptive Circular Viterbi Algorithm for Decoding Generalized Tail-biting Convolutional Codes", IEEE Transactions on Vehicular Technology, Vol. 43, No. 1, pp. 57–68, February 1994]. With such a scheme, the "starting state=ending state" property of the tail-biting code could be used implicitly or explicitly.

Recently, a number of sub-optimal decoding algorithms have been proposed in order to make the decoder complexity low enough for practical applications. A two (2) step sub-optimum algorithm proposed by Ma and Wolf [H. H. Ma and J. K. Wolf, "On Tail Biting Convolutional Codes", IEEE Transactions on Communications, Vol. COM-34, No. 2, pp. 104–111, February 1986] is only somewhat simpler than the optimum decoder. For real-time applications, such high complexity (which increases exponentially) techniques are not generally affordable in terms of computational power.

Sub-optimum algorithms proposed by Bar-David [H. H. Ma and J. K. Wolf, "On Tail Biting Convolutional Codes", IEEE Transactions on Communications, Vol. COM-34, No. 2, pp. 104–111, February 1986] and Wang and Bhargava [Q. Wang and V. K. Bhargava, "An Efficient Maximum Likelihood Decoding Algorithm for Generalized Tail Biting Convolutional Codes Including Quasicyclic Codes", IEEE Transactions on Communications., Vol. 37, No. 8, pp. 875–879, August 1989], reduce the computational complexity on an average basis. However, at times, they approach the complexity of the optimal decoding algorithm, especially in low and intermediate channel signal-to-noise ratio. Due to involving a variable number of trials, these schemes are not ideal for our implementation where worst-case complexity also has to be reasonable.

U.S. Pat. No. 5,349,589, Issue Date: Sep. 20, 1994; S. Chennakeshu and R. L. Toy, "Generalized Viterbi Algorithm with Tail-Biting", and U.S. Pat. No. 5,369,671, Issue Date: Nov. 29, 1994; Yehushua, M., Watson, J., and Parr, M., "System and Method for Decoding Tail-Biting Code Especially Applicable to Digital Cellular Base Station and Mobile Units" describe decoding techniques for tail-biting codes. U.S. Pat. No. 5,369,671 describes a method or control message (in quadruple form) decoding, that is not concerned with puncturing, i.e., with high-rate code, that applies pure Viterbi algorithm technique and that assumes a pre-determined starting state. U.S. Pat. No. 5,349,589 describes a method that starts with all the possible states and finds out which one provides the lowest metric (this implies quite high complexity), that applies the Viterbi algorithm and a trace-back technique for bit decisions, and that utilizes the "starting stage=ending stage" property for tail-biting code explicitly.

In addition to hard-decision decoding, there are also soft-decision decoding techniques that can be applied for tail-biting codes. A circular MAP decoder is presented in U.S. Pat. No. 5,721,746. Another efficient adaptive circular Viterbi algorithm using soft-decision decoding is studied in

[R. V. Cox and C-E. W. Sundberg, "An Efficient Adaptive Circular Viterbi Algorithm for Decoding Generalized Tail-biting Convolutional Codes", IEEE Transactions on Vehicular Technology, Vol. 43, No. 1, pp. 57–68, February 1994; Cox, R. V. and Sundberg, C-E. W., "Circular Viterbi Decoder", U.S. Pat. No. 5,355,376, Issue Date: Oct. 11, 1994].

From the above discussion, it can be seen that there is a need for a sub-optimal channel decoder for decoding both low and high rate tail-biting convolutional codes that is less complex (and therefore computationally less demanding) and yet has error performance close to that of an optimal channel decoder.

SUMMARY OF THE INVENTION

The present invention is directed to a method for hard-decision channel decoding of tail-biting convolutional codes. The method includes the step of receiving from a channel an input bit stream encoded by a tail-biting convolutional channel encoder. The encoder includes a number of memory elements and has a rate. The input bit stream includes a series of symbols, each symbol includes a number of bits, and the number of bits per symbol is related to the rate of the encoder. The method further includes the step of assuming a probability for each possible initial state of the encoder. The method further includes the step of deciding each symbol of the input bit stream using majority logic, with reference to a trellis structure corresponding to the encoded bits as modified by repetition for encoding. The trellis structure represents a number of states per stage related to the number of memory elements of the encoder, a plurality of transitional branches in each stage, and a number of stages related to the number of symbols in the input bit stream as modified.

The present invention is further directed to an apparatus for hard-decision channel decoding of tail-biting convolutional codes. The apparatus includes a first bit stream reader for receiving from a channel an input bit stream encoded by a tail-biting convolutional channel encoder. The encoder includes a number of memory elements and has a rate. The input bit stream includes a series of symbols, each symbol includes a number of bits, and the number of bits per symbol is related to the rate of the encoder. The apparatus further includes an initial state estimator for assuming a probability for each possible initial state of the encoder. The apparatus further includes a decider for deciding each symbol of the input bit stream using majority logic on decoded bits derived with reference to a trellis structure corresponding to the encoded bits as modified by repetition for decoding. The trellis structure represents a number of states per stage related to the number of memory elements of the encoder, a plurality of transitional branches, and a number of stages related to the number of symbols in the input bit stream as modified.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

The embodiments of the invention will now be described with reference to the accompanying drawings, in which.

DETAILED DESCRIPTION OF THE PRESENTLY PREFERRED EMBODIMENT

Figure 4A:
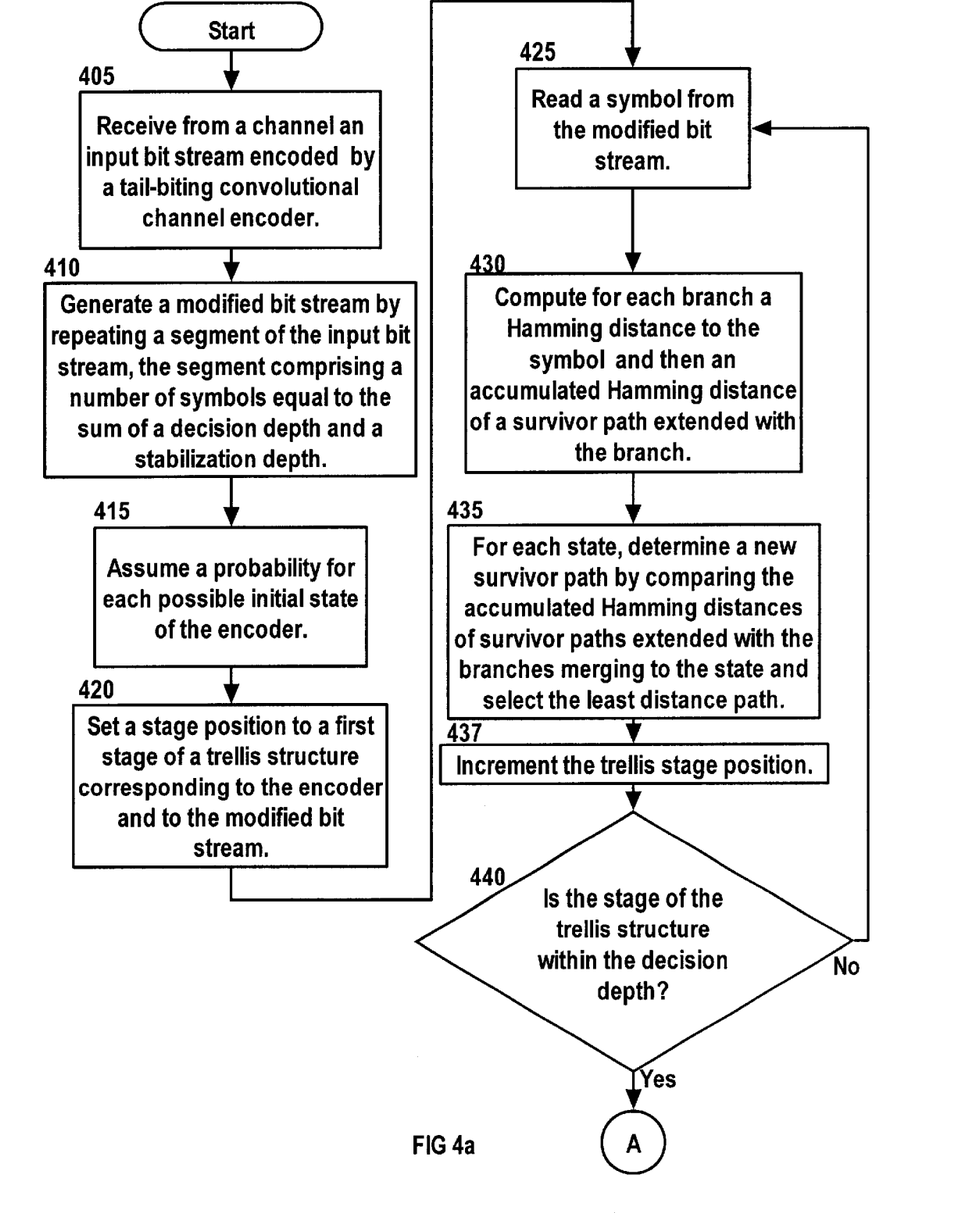
FIGS. 4a and 4b is a flowchart of a low-complexity sub-optimal hard-decision channel decoding method for low-rate tail-biting convolutional codes embodying the present invention.
Figure 4B:
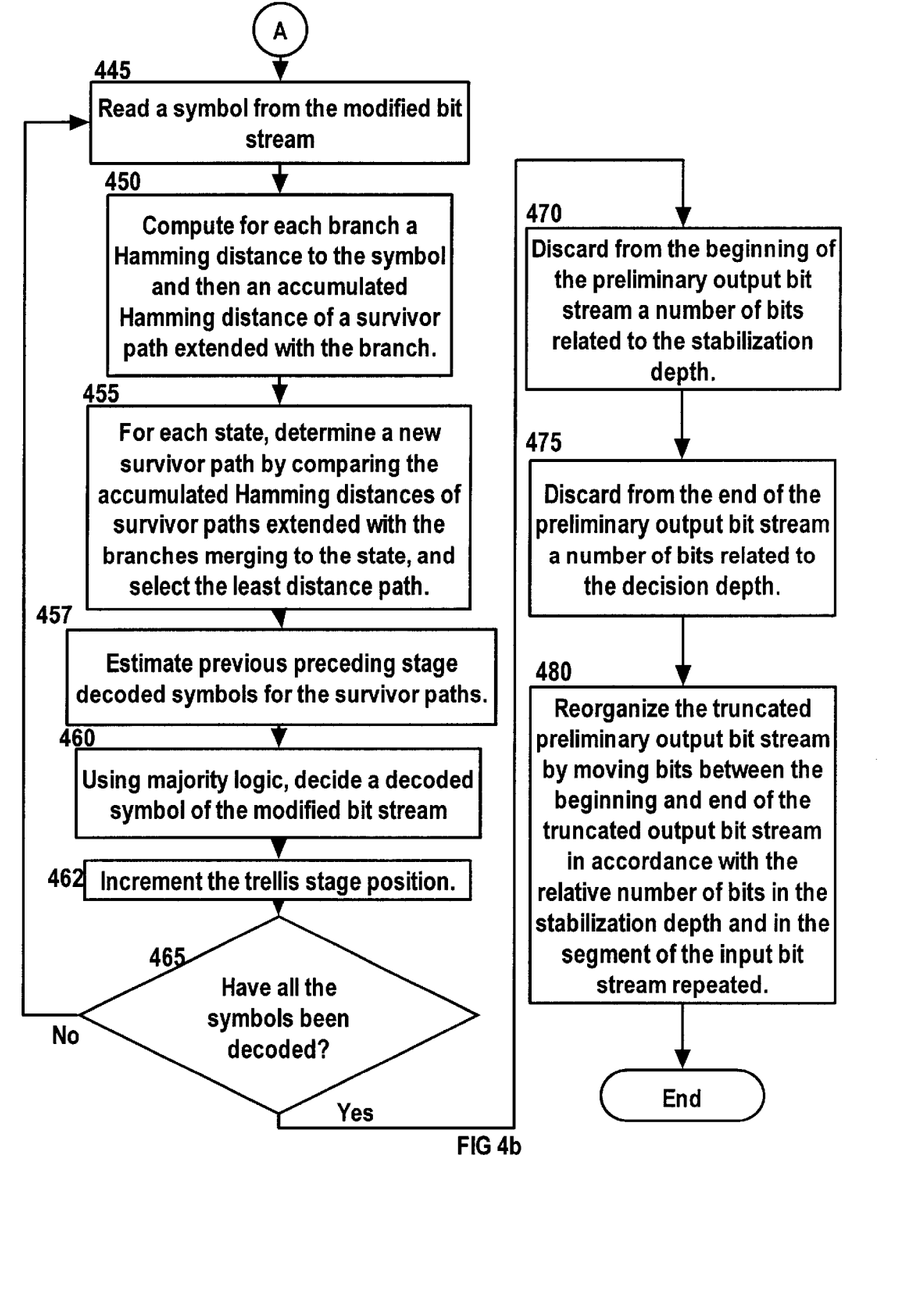

With reference to FIGS. 4a and 4b, an embodiment of the present invention is directed to a method for hard-decision channel decoding of tail-biting convolutional codes. The method includes the step of receiving from a channel 405 an input bit stream encoded by a tail-biting convolutional channel encoder. The encoder includes a number of memory elements and has a rate. The input bit stream includes a series of symbols, each symbol includes a number of bits, and the number of bits per symbol is related to the rate of the encoder. The method further includes the step of generating a modified bit stream 410 including a number of symbols produced by repeating a segment of the input bit stream. The segment includes a number of symbols; the number of symbols is equal to the sum of a code-defined decision depth and a code-defined stabilization depth. The method further includes the step of assuming an initial accumulated Hamming distance for each possible initial state of the encoder 415. The method further includes the step of applying a first stage of a trellis structure corresponding to the modified bit stream 420. The trellis structure represents a number of states per stage related to the number of memory elements of the encoder, a plurality of transitional branches in each stage, and a number of stages related to the number of symbols in the modified bit stream. The method further includes the steps of, for each stage of the trellis structure within the decision depth 440: reading a symbol from the modified bit stream 425; for each transitional branch to each state, computing a Hamming distance to a symbol and then an accumulated Hamming distance of a survivor path extended with the branch 430; and for each state, determining a new survivor path by comparing the accumulated Hamming distances for the survivor paths merging to the state 435. The method further includes the step of generating a preliminary output bit stream including a beginning and an end by executing the following steps for each stage of the trellis structure outside the decision depth 465: reading a symbol from the modified bit stream; for each transitional branch to each state 445, computing a Hamming distance to the symbol and then an accumulated Hamming distance of a survivor path extended with the branch, for each state 450, determining a new survivor path by comparing the accumulated Hamming distances for the transitional branches merging to the state 455; and using majority logic for deciding each symbol of the modified bit stream to produce a preliminary output bit stream 460. The method further includes the step of deriving a truncated preliminary output bit stream including a beginning and an end by: discarding from the beginning of the preliminary output bit stream a number of bits related to the stabilization depth 470; and discarding from the end of the preliminary output bit stream a number of bits related to the decision depth 475. The method further includes the step of deriving an output bit stream by reorganizing the truncated preliminary output bit stream by moving bits between the beginning and end of the truncated output bit stream in accordance with the number of bits in the stabilization depth and in the segment of the input bit stream repeated 480.

Figure 5:
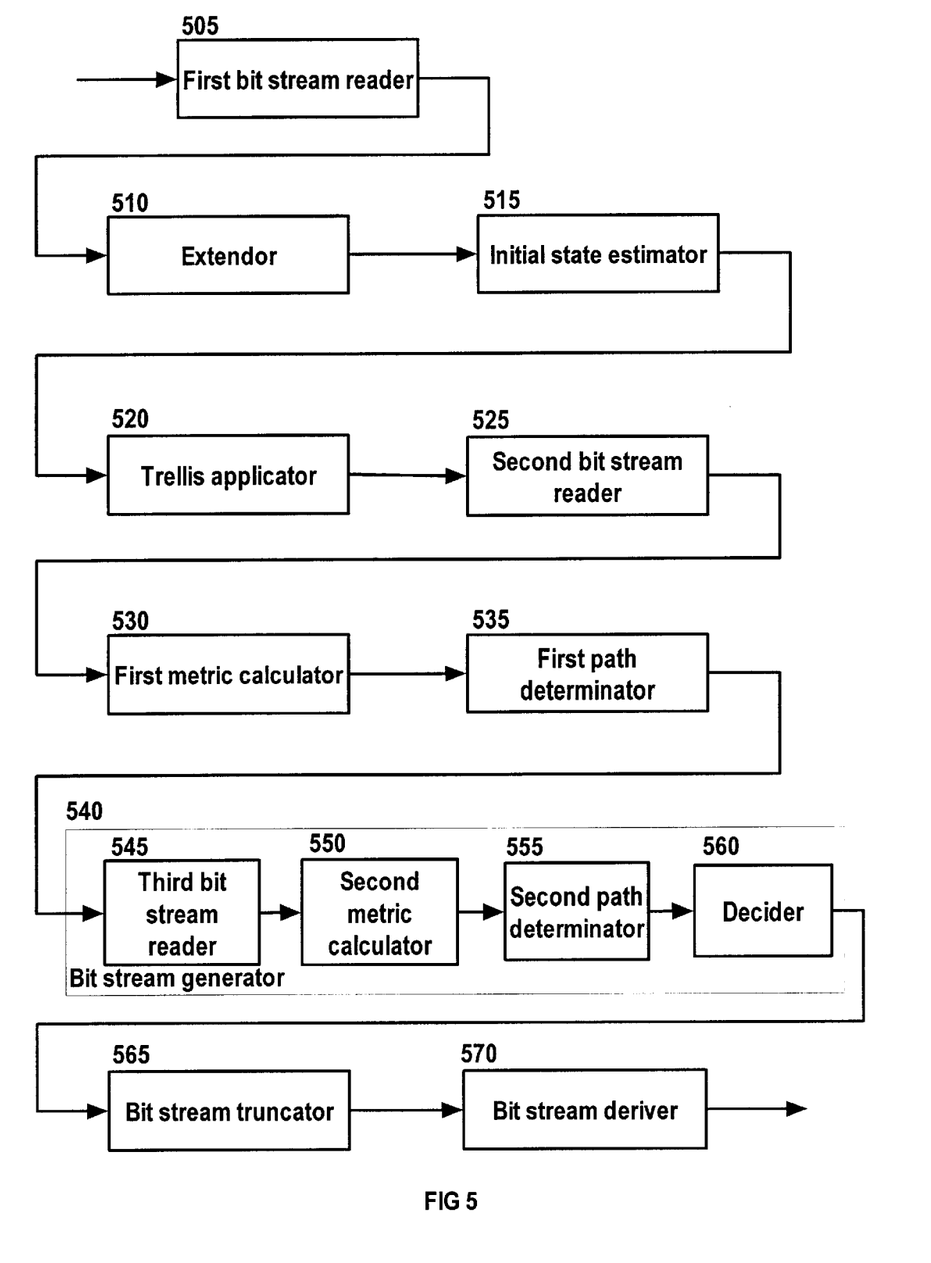
FIG. 5 is a block diagram of a low-complexity sub-optimal hard-decision channel decoding apparatus for low-rate tail-biting convolutional codes embodying the present invention.

With reference to FIG. 5, an embodiment of the present invention is directed to an apparatus for hard-decision channel decoding of tail-biting convolutional codes. The apparatus includes a first bit stream reader 505 for receiving from a channel an input bit stream encoded by a tail-biting convolutional channel encoder. The encoder includes a number of memory elements and has a rate. The input bit stream includes a series of symbols, each symbol includes a number of bits, and the number of bits per symbol is related to the rate of the encoder. The apparatus further includes an extendor 510 for generating a modified bit stream including a number of symbols produced by repeating a segment of the input bit stream. The segment includes a number of symbols equal to the sum of a code-defined decision depth and a code-defined stabilization depth. The apparatus further includes an initial state estimator 515 for assuming an initial accumulated Hamming distance for each possible initial state of the encoder. The apparatus further includes a trellis applicator 520 for setting a stage position to a first stage of a trellis structure corresponding to the encoder and the modified bit stream. The trellis structure represents a number of states per stage related to the number of memory elements of the encoder; a plurality of transitional branches in each stage, and a number of stages related to the number of symbols in the modified bit stream. The apparatus further includes, with respect to each stage of the trellis structure within the decision depth: a second bit stream reader 525 for reading a symbol from the modified bit stream; with respect to each transitional branch in each state, a first metric calculator 530 for computing a Hamming distance to the symbol, and then an accumulated Hamming distance of a survivor path extended with the branch; and with respect to each state, a first path determinator 535 for determining a new survivor path by comparing the accumulated Hamming distances for the survivor paths merging to the state. The apparatus further includes a bit stream generator 540 for generating a preliminary output bit stream including a beginning and an end, the bit stream generator including, with respect to each stage of the trellis structure outside the decision depth: a third bit stream reader 545 for reading a symbol from the input bit stream; with respect to each transitional branch in each state, a second metric calculator 550 for computing a Hamming distance to the symbol and then an accumulated Hamming distance of a survivor path extended with the branch; with respect to each state, a second path determinator 555 for determining a survivor path by comparing the accumulated Hamming distances of the transitional branches merging with the state; and a decider 560 for deciding each symbol of the input bit stream using majority logic to produce a preliminary output bit stream. The apparatus further includes a bit stream truncator 565 for deriving a truncated preliminary output bit stream including a beginning and an end by: discarding from the beginning of the preliminary output bit stream a number of bits related to the stabilization depth; and discarding from the end of the preliminary output bit stream a number of bits related to the decision depth. The apparatus further includes a bit stream deriver 570 for deriving an output bit stream by reorganizing the truncated preliminary output bit stream by moving bits between the beginning and end of the truncated output bit stream in accordance with the relative number of bits in the stabilization depth and in the segment of the input bit stream repeated.

With reference to the FIGS. 4a, 4b, 5 and 6, a decoding system embodying the present invention decodes a stream of E encoded bits that are encoded from L input bits using a tail-biting convolutional encoding procedure. The decoding system, which uses a hard-decision decoding scheme, may also be used for high-rate tail-biting codes that employ a puncturing mechanism. The following steps are involved in the decoding process of this embodiment.

Input Sequence Generation: The decoder first generates an input sequence from the stream of E encoded bits by copying the first S encoded bits to the end of the stream. The decoding scheme is applied to all the (E+S) bits and not to the E encoded bits only.

Starting State Selection: A predetermined starting state may be selected, with the hope that the detection error effect will disappear after traversal of a few trellis stages. Alternatively, a random starting state may be chosen, with the knowledge that more than one run will be carried out. It is presently preferred to start the algorithm of the present invention with all states equally likely. This is valid due to the nature of the input sequence introduced by the tail-biting mechanism in the encoder. Construction of Trellis Stages: A trellis diagram is constructed with a number of trellis stages that cover (E+S) encoded bits. Each stage has all possible states and pertains to a bit(s) received during a single time period. In the case of punctured code, the input bits may contain erasure bits. For the same number of E encoded bits, the number of trellis stages involved for a high-rate punctured code is higher than that required for the original low-rate code.

Decision Depth Determination: The decision depth of a convolutional code is the depth of the first trellis at which all incorrect subset paths, except those merged to the transmitted path, exceed a particular weight [J. B. Anderson and K. Balachandran, "Decision Depths of Convolutional Codes", IEEE Transactions on Information Theory, Vol. 35, No. 2, pp. 455–459, March 1989]. A proper decision depth (D) relating path memory and minimum distance is determined for a specific tail-biting code. It is preferred not to traverse all trellis stages before making decisions about input bits. Instead, a decision about each input bit is made once a decision depth of D is attained beyond the concerned trellis stage.

Decoding Metric Computation: Hamming distance is the metric for hard-decision decoding [Lin, S., Costello, D. J., "Error Control Coding: Fundamentals and Applications", Englewood Cliffs, N.J.: Prentice-Hall, 1983]. Since it is assumed in this embodiment that all initial states have an equal likelihood of occurrence, each initial state Hamming distance is made equal to zero. The decoding is performed on the trellis of the original low-rate code. In the case of high-rate punctured code, the metric increments corresponding to the punctured code (i.e., erasure) bits are discarded.

Deciding Operation Using Majority Logic: It is known for frame based algorithms to use Viterbi decoding with a traceback mechanism [H. H. Ma and J. K. Wolf, "On Tail Biting Convolutional Codes", IEEE Transactions on Communications, Vol. COM-34, No. 2, pp. 104–111, February 1986; Q. Wang and V. K. Bhargava, "An Efficient Maximum Likelihood Decoding Algorithm for Generalized Tail Biting Convolutional Codes Including Quasicyclic Codes", IEEE Transactions on Communications., Vol. 37, No. 8, pp. 875–879, August 1989; S. Chennakeshu and R. L. Toy, "Generalized Viterbi Algorithm with Tail-Biting", U.S. Pat. No. 5,349,589, Issue Date: Sep. 20, 1994; Yehushua, M., Watson, J., and Parr, M., "System and Method for Decoding Tail-Biting Code Especially Applicable to Digital Cellular Base Station and Mobile Units", U.S. Pat. No. 5,369,671, Issue Date: Nov. 29, 1994]. The embodiment uses a somewhat similar trellis structure. However, instead of a maximum likelihood decision, i.e. requiring unanimity, we follow a majority-logic decision scheme [Lin, S., Costello, D. J., "Error Control Coding: Fundamentals and Applications", Englewood Cliffs, N.J.: Prentice-Hall, 1983]. With a defined decision depth D, at any depth (D+K), we make a decision about the K-th stage input bit(s) by simple majority logic. At a stage (D+K), we go back to the K-th stage and perform a majority vote on the decoded bits of all states in order to obtain the decoded bit(s) for the K-th stage. The decoded bit(s) which has the majority of occurrences among all the states is selected at each decision point. Instead of considering all the states at the (D+K)-th stage as a starting point for going back, only a fixed number of states associated with the lowest accumulated Hamming distances may be considered. Then, for those selected states, the decoded bit(s) at the K-th stage are determined and majority logic is applied. In this scheme, the property of "starting state=ending state" for tail-biting code has been used implicitly.

Decoded Sequence Generation: Because of the uncertainty in the actual starting state, the first few decoded bits are not accepted in the final decoded sequence. Since the modified input bit stream, at the end, contains bits from the beginning of the input bit stream, the decoded bits corresponding to the first few bit positions are obtained from the extended segment of the modified bit stream.

Rate-1/2 code has better performance than rate-5/6 code in terms of BER and FER because of higher free distance. However, rate-5/6, when used in conjunction with ARQ, offers better throughput under most of the channel types and conditions. A rate-5/6 channel encoder is defined in IS-130A [Interim Specification 130 (IS-130A), International Telecommunication Union] for TDMA circuit-switched data. FIG. 2 illustrates one such encoder with memory length of 5. The input to the rate-1/2 encoder is a 216-bit radio-link protocol (RLP) frame. The discrete impulse response of the left-side of the rate-1/2 encoder is: (1,1,0,1,0,1) whereas that of the right-side of the same encoder is: (1,0,1,1,1,1).

In the FEC process, a tail-biting mechanism is employed. For each 216-bit RLP frame, the encoder memory is initialized with the b0, b1, b2, b3 and b4 input bits. These bits are again passed as inputs at the end of the original 216-bit input bit (i.e., after b215 bit). At the output, the puncturer passes all the bits from the right stream, however, it passes only every fifth bit on the left stream. For a 216-bit RLP frame, 44 bits are added by the convolutional encoder to form a 260-bit RLP encoded frame. The output bits are marked as (Glp0, Gr0, Gr1, Gr2, . . . , Glp43, Gr215). In this particular case, it is evident that 44 output bits are taken from the left stream whereas 216 output bits are produced through the right stream.

The original rate-1/2 code has a free distance of 8, while it is only 4 for the derived rate-5/6 code. Based on the analysis in J. B. Anderson and K. Balachandran, "Decision Depths of Convolutional Codes", IEEE Transactions on Information Theory, Vol. 35, No. 2, pp. 455–459, March 1989, a decision depth of 24–28 is appropriate for rate-1/2 code whereas a depth of 40–45 needs to be considered for rate-5/6 code. Decoding for a high-rate (derived by puncturing a low-rate) code encompasses a mechanism for decoding a low-rate code.

With this code, for an encoded frame of 260 bits (216 stages), we have extended the sequence to 452 bits by copying the first 192 bits (160 stages) to the end of the bit-stream. Since all possible initial states are equally likely, we start the trellis traversal with a decoding metric equal to zero for all states. Altogether, we traverse (216+160)=376 trellis stages for 376 symbols containing 452 bits and 300 erasure bits. For hard-decision decoding, the accumulated Hamming distance metric increases by 0, 1 or 2 in the trellis stages where there are no punctured bits; but it increases only by 0 or 1 in the subsequent four trellis stages and so on. This is due to the fact that a symbol in the non-punctured case, as well as the punctured case after depuncturing is done before the decoder, contains two bits. On the other hand, when depuncturing is done while doing the decoding, the symbol contains one received bit and one erasure bit.

After traversal of 40 (i.e. the chosen decision depth) stages, we go back to the first stage and decide on the probable input bit by a majority vote. Continuing in this way, at the end of 376 trellis stages, we make a decision about (376–40)=336 decoded bits (336 trellis stages). We discard the first 120 decoded bits, considering here that to be the stabilization depth and also discard the last 40 decoded bits as they have less ability to correct errors. From the truncated preliminary output bit stream, the last 120 decoded bits are placed at the beginning in order to form a proper 216-bit RLP frame.

It has been determined that the embodiment described above shows 0.2–0.3 dB performance degradation compared to the optimal Viterbi hard decision algorithm for a wide range of carrier-to-interference level. The illustrated embodiment is a low complexity algorithm that makes a relatively small sacrifice in terms of error tolerance performance.

Now, we illustrate another variation of our algorithm. From this encoded frame of 260 bits, we have extended the sequence to 368 bits by copying the first 48 bits (x=40 symbols for rate-5/6 code) to the end of the input sequence and copying the last 60 bits (y=50 symbols for rate-5/6 code) to the beginning of the input sequence. The extended sequence of 368 bits corresponds to 306 symbols. Due to puncturing, every fifth symbol contains two bits; all other symbols contain one bit.

All possible initial states are assumed to be equally likely. For this code with constraint length (memory elements) equal to 5, there are $2^5=32$ states, which is shown in a trellis structure in FIG. 6. This trellis structure contains 306 trellis stages—50 stages related to the first extension, 216 stages related to the original sequence and 40 stages related to the last extension. It is to be noted that the trellis structure used for the rate-5/6 code is the same as that to be used with the rate-1/2 code from which the former is derived.

The channel decoder, after receiving a symbol from the channel, computes decoding metric. For soft-decision decoding, the Euclidean distance is computed. For hard-decision decoding, the Hamming distance is the metric. Initiating the decoding process with all states equally likely means that the accumulated Hamming distance is assumed to be equal (assumed zero, without any loss of generality) for all states.

For rate-1/2 code, a decision depth of 24–28 is sufficient with constraint length=5. However, for rate-5/6 code, a decision depth of 40–45 needs to be chosen with the same encoder memory length. Let us consider a decision depth of 40 for further illustration. This means that a decision about an input bit for the K-th stage is made after reaching the (K+40)th stage. After reading the (K+40)-th trellis stage, the K-th stage is considered and a majority vote on the estimated decoded bits is performed.

Figure 6:
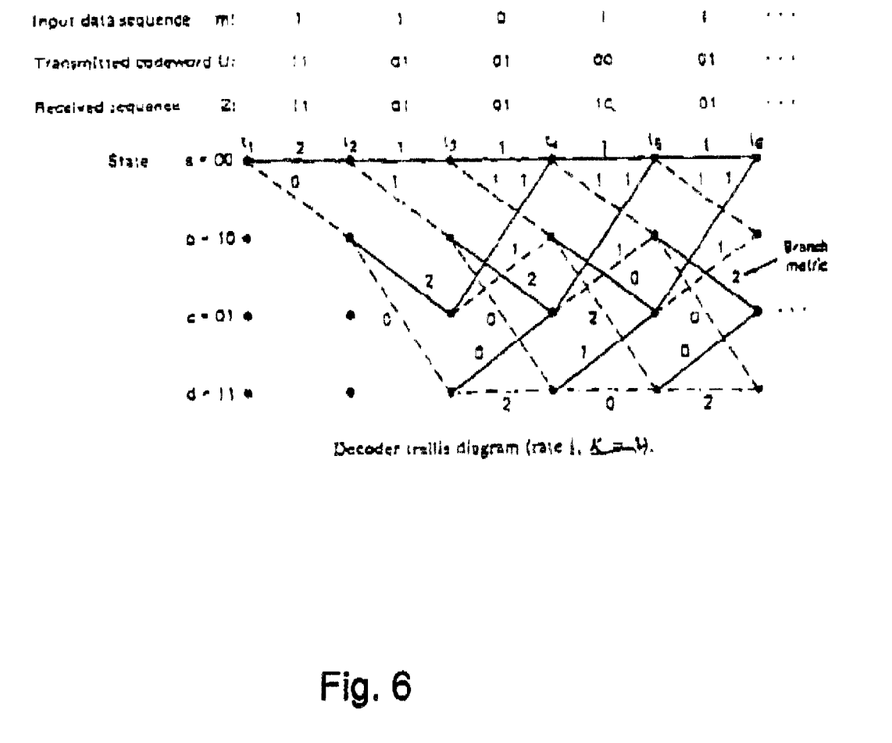
FIG. 6 is a trellis diagram for the decoding method of FIGS. 4a and 4b.

Instead of considering a 32-state trellis, just consider a trellis of 4 states for a rate-1/2 code with m=3 in FIG. 6. This trellis diagram shows how the initial part of the trellis would look for a non-tail-biting code. For a tail-biting code, the first stage of FIG. 6 would be a stage where all states are possible. From each state, there are two branches emanating. For any received symbol, the Hamming distance is computed for all 64 paths. In case of punctured code, the received symbols may contain one received bit and an erasure bit. While computing the decoding metric, the erasure bit is not considered.

With 32 accumulated Hamming distance for 32 states, 32*2=64 computed Hamming distances are accumulated for any stage. There are two branches merging to each state. From the two branches reaching the same state, only the one having the lower Hamming distance survives beyond that trellis stage and thus becomes part of the survivor path for that state. Each state retains an accumulated Hamming distance and a survivor path (i.e., 40 estimated bits).

After reaching the (K+40)-th stage, the survivor paths stored for all the states are considered. 32 bits corresponding to the K-th bit positions from the 32 survivor paths are gathered and a majority voting is performed. If the number of 0's is more than the number of 1's then 0 is decided as the decoded bit for the K-th stage, and vice versa. In case of a tie, 0 or 1 could be randomly chosen.

For the last 40 stages, no majority voting is required to be performed. Here, we have assumed the stabilization depth to be 50, thereby meaning that the first 50 decoded bits are not taken into account in the final output bit stream. As the last 40 stages are not applied to majority voting, the last 40 decoded bits, corresponding to decision depth, are not considered in the final output.

Because of a prudent choice of extension length (at the beginning and end), the output sequence formation in this case does not require any reordering. For x=30, y=60, the output sequence will require reordering. With the stabilization depth of 50 and a decision depth of 40 in this case, the final output bit stream will involve the $61^{st}$ to $276^{th}$ stage decoded bits corresponding to the first 206 outputs and the $51^{st}$ to $60^{th}$ stage decoded bits corresponding to the last 10 outputs.

Now, we discuss variants of several components of our decoding algorithm. Note that the Viterbi algorithm has been proven to be optimal mathematically for memory-less channels. Embodiments of the present invention with majority logic may or may not attain optimal performance. Especially with the incorporation of the concept of decision depth, sub-optimality may result. However, the degree of sub-optimality may be negligible or unimportant in a given application if the decision depth is properly selected by a person skilled in the art. The present invention is not restricted to low complexity or sub-optimal applications.

Note that the illustrated embodiments of the present invention relate to hard-decision decoding of tail-biting codes. However, the present invention is equally applicable for soft-decision decoding if traceback is adopted in place of majority logic. The fundamental difference between hard decision decoding and soft decision decoding lies in the metric definition. In hard decisions, the relevant metric is the Hamming distance. In the case of soft decision decoding, the metric in the context of the trellis diagram is the Euclidean distance, which involves a modulation-demodulation scheme.

Note that the present invention can be applied for decoding of tail-biting convolutional codes used in any digital system (e.g., transmission, storage). In particular, the method has been applied in the context of wireless personal communication system with AWGN and fading channels. The present invention is independent of a multiple accessing scheme. However, embodiments of the invention have been applied for North American TDMA systems. In practice, it may be applied in conjunction with GSM TDMA as well as CDMA systems. The illustrated embodiments of the present invention have been applied for data packets. However, the present invention is also applicable to voice and control signals.

Note that the present invention is independent of the puncturing process. Decoding schemes embodying the present invention will work with optimal as well as with sub-optimal puncturers as described in [Haccoun, D. and Begin, G., "High-Rate Punctured Convolutional Codes for Viterbi and Sequential Decoding", IEEE Transactions on Communications, Vol. 37, No. 11, 1989; Hagenauer, J., Seshadri, N., and Sundberg, C-E. W., "The Performance of Rate-Compatible Punctured Convolutional Codes for Digital Mobile Radio", IEEE Transactions on Communications, Vol. 38, No. 7, 1990]. For example, from a rate-1/2 code, many rate-516 codes could be generated.

Note that decoding schemes embodying the present invention may be applied for low-rate (rate-1/2, -1/3, -1/4 and so on) as well as high-rate (rate-3/4, 5/6) tail-biting codes. Such decoding schemes may also be applied for high-rate tail-biting codes derived from low-rate code by puncturing. The rate of punctured codes derived from a rate-1/N is of the form: r=(m+N-1)/(m+N) code (e.g., for m=1, N=2, R=2/3; m=2, N=2, r=3/4; m=3, N=2, r=4/5; m=4, N=2, r=5/6; m=1, N=3, r=3/4 and so on). The puncturer element may be optimal or sub-optimal [Haccoun, D. and Begin, G., "High-Rate Punctured Convolutional Codes for Viterbi and Sequential Decoding", IEEE Transactions on Communications, Vol. 37, No. 11, 1989; Hagenauer, J., Seshadri, N., and Sundberg, C-E. W., "The Performance of Rate-Compatible Punctured Convolutional Codes for Digital Mobile Radio", IEEE Transactions on Communications, Vol. 38, No. 7, 1990].

Note that instead of a continuous run of the extended sequence, a decoding scheme embodying the present invention could be applied on multiple independent runs of the original sequence. Hamming distance metrics for all the trellis states at the end of each run could be used as an estimator for the probabilities of each state in the next run.

Note that in the illustrated embodiment, we have assumed complete uncertainty about the initial state. Therefore, all states are considered equally likely. However, if there is any external device to estimate probable initial states, some of the states could be eliminated. In that case, the length of sequence extension may be less compared to the case where all initial states are equally likely.

Note that for making a hard-decision estimate on a decoded bit, majority voting is done on the bits (from survivor paths) corresponding to all the states. However, a few states may be chosen based on low cumulative Hamming distance and then the majority logic algorithm may be applied in a similar fashion. The number of states chosen could be varying.

Note that the decoding metric value of embodiments of the present invention could be used as a reverse channel quality measure. It may be used in the computation of short-term, medium-term as well as long-term bit-error-rate (BER) average, which, in turn, aids in hand-off and other kinds of decisions in wireless communication systems.

Note that decoding schemes embodying the present invention can work for tail-biting convolutional codes with different constraint lengths (i.e., encoder memory) and different encoder polynomials. Also, if the tail-biting code is used as part of a concatenated code, the decoding scheme is still applicable.

Note that the tail-biting code is circular in nature. One type of encoding for tail-biting codes initializes the encoder memory with the first few bits; then, it passes the remaining bits to the encoder followed by the first few bits again. On the other extreme, there are types of encoding for tail-biting codes which initialize the encoder memory with the last few bits and then pass the entire bit stream to the encoder from start to end. Our method is applicable for all circular tail-biting codes.

Note that with respect to the tail-biting process, part of the received sequence may be adjoined to extend the sequence to be decoded. The first few bits may be appended at the end of the sequence. Similarly, the last few bits may be prepended at the beginning of the sequence. A system in accordance with the present invention can choose either of the techniques. For punctured code, it may need special treatment at the extension boundary especially when the depuncturing is done while decoding.

Note that with respect to the tail-biting process, the length of extension, be it at the beginning or at the end, can be varying. Either the entire or a partial encoded sequence could be repeated at the beginning or at the end. Only requirement is that all encoded bits corresponding to a trellis stage have to be included while extending the sequence.

Note that upon decoding of the extended sequence, there are many ways of formulating the estimated transmitted sequence. Since the initial state is unknown, we will not consider the first few estimated bits corresponding to stabilization depth. There is a minimum depth that will be required for stabilization purposes. But a depth higher than the minimum depth may be chosen for stabilization depth. Because of the extension, the bits for the same bit positions occur another time. Therefore, we consider those estimated bits in the final decoded sequence.

Note that the decoding scheme applies for all tail-biting codes irrespective of whether the code has been used in conjunction with an ARQ scheme, data compression, data encryption, or data interleaving.

Note that the trellis structure mentioned here could be based on a tree diagram, trellis diagram, look-up table, or any other structure that contains pertinent information about the trellis.

Note that the decoding works independent of whether we use decision depth concept. Traversal of all the trellis stages may be completed first and then the decision, by majority logic, on all the bits may be taken simultaneously. In this case, it may be viewed that the first stage has one higher decision depth than the second stage and so on.

Note that the present invention provides a solution for hard-decision decoding of tail-biting convolution codes. However, many of the solution steps are equally applicable in soft-decision decoding.

Figure 7:
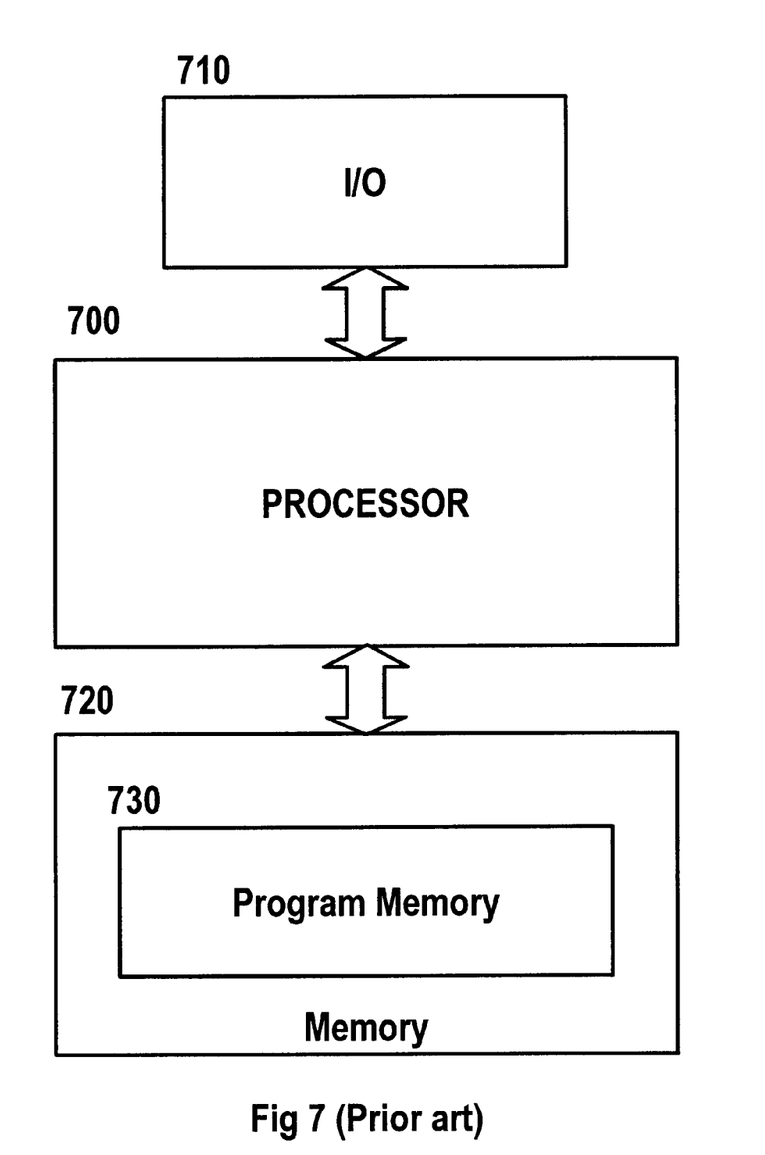
FIG. 7 shows a processor system suitable for embodiments of the invention.

FIG. 7 shows a processor system suitable for embodiments of the invention. A processor 600 interacts with the memory 620, which includes program memory 630 within which embodiments of the invention may be stored. An input-output I/O module 610 allows interaction with the transmission environment.

While the present invention has been described in connection with what is presently considered to be the most practical and preferred embodiments, it is to be understood that the invention is not limited to the disclosed embodiments. To the contrary, the present invention is intended to cover various modifications, variations, adaptations and equivalent arrangements included within the spirit and the scope of the appended claims. The scope of the claims is to be accorded the broadest interpretation so as to encompass all such modifications and equivalent structures and functions.

What is claimed is:

1. A method for hard-decision channel decoding of tail-biting convolutional codes, the method comprising the steps of:
   a. receiving from a channel an input bit stream encoded by a tail-biting convolutional channel encoder, the encoder comprising a number of memory elements and having a rate, the input bit stream comprising a series of symbols, each symbol comprising a number of bits, the number of bits per symbol being related to the rate of the encoder;
   b. generating a modified bit stream comprising a number of symbols by repeating a segment of the input bit stream, the segment comprising a number of symbols, the number of symbols being equal to the sum of a decision depth and a stabilization depth;
   c. assuming an initial accumulated Hamming distance for each possible initial state of the encoder;
   d. setting a stage position to a first stage of a trellis structure corresponding to the encoder, the trellis structure representing:
      i. a number of states, the number of states being related to the number of memory elements of the encoder;
      ii. a plurality of transitional branches; and
      iii. a number of stages, the number of stages being related to the number of symbols in the modified bit stream;
   e. for each stage of the trellis structure within the decision depth:
      i. reading a symbol from the modified bit stream;
      ii. for each transitional branch in each state, computing a Hamming distance to the symbol and then an accumulated Hamming distance of a survivor path extended with the branch; and
      iii. for each state, determining a survivor path by comparing the accumulated Hamming distances for the survivor paths merging to the state;
   f. generating a preliminary output bit stream comprising a beginning and an end by executing the following steps for each stage of the trellis structure outside the decision depth:
      i. reading a symbol from the modified bit stream;
      ii. for each transitional branch in each state, computing a Hamming distance to the symbol and then an accumulated Hamming distance of a survivor path extended with the branch;
      iii. for each state, determining candidate survivor paths by comparing the accumulated Hamming distances for the survivor paths merging to the state, storing each said survivor path as a candidate survivor path; and
      iv. using majority logic on said stored candidate survivor paths, deciding each decoded symbol of the modified bit stream;

g. deriving a truncated preliminary output bit stream comprising a beginning and an end by:
   i. discarding from the beginning of the preliminary output bit stream a number of bits related to the stabilization depth; and
   ii. discarding from the end of the preliminary output bit stream a number of bits related to the decision depth; and
h. deriving an output bit stream by reorganizing the truncated preliminary output bit stream by moving bits between the beginning and end of the truncated output bit stream in accordance with the relative number of bits in the stabilization depth and in the segment of the input bit stream repeated in step "b".

2. A method as defined in claim 1, wherein step "f(iv)" further comprises during the deciding process the step of eliminating states having relatively high Hamming distances, thereby removing such states from the decision making process.

3. A method as defined in claim 1, wherein the input bit stream has a beginning and an end, and wherein the segment of the input bit stream referred to in step "b" is located at the beginning of the input bit stream, and wherein the segment is repeated at the end of the input bit stream.

4. A method as defined in claim 1, wherein the input bit stream has a beginning and an end, and wherein the segment of the input bit stream referred to in step "b" is located at the end of the input bit stream, and wherein the segment is repeated at the beginning of the input bit stream.

5. A method as defined in claim 1, wherein the input bit stream has a beginning and an end, and wherein there is a beginning segment located at the beginning of the input bit stream and an end segment located at the end of the input bit stream, and wherein the beginning segment is repeated at the end of the input bit stream and the end segment is repeated at the beginning of the input bit stream.

6. A method as defined in claim 1, wherein in step c, the initial accumulated Hamming distance for each possible initial state of the encoder assumes the probability for each possible initial state of the encoder to be equal.

7. A method as defined in claim 1, wherein in step c, the initial accumulated Hamming distance for each possible initial state of the encoder assumes the initial state of the encoder to be set randomly.

8. A method as defined in claim 1, wherein in step c, the initial accumulated Hamming distance for each possible initial state of the encoder assumes the initial state of the encoder to be the final state from a previous frame.

9. An apparatus for hard decision channel decoding of tail biting convolutional codes, the apparatus comprising:
   a. means for receiving from a channel an input bit stream encoded by a tail-biting convolutional channel encoder, the encoder comprising a number of memory elements and having a rate, the input bit stream comprising a series of symbols, each symbol comprising a number of bits, the number of bits per symbol being related to the rate of the encoder;
   b. means for generating a modified bit stream comprising a number of symbols by repeating a segment of the input bit stream, the segment comprising a number of symbols equal to the sum of a decision depth and a stabilization depth;
   c. means for assuming an initial accumulated Hamming distance for each possible initial state of the encoder;
   d. means for setting a stage position of a first stage of a trellis structure corresponding to the encoder, the trellis structure representing:
      i a number of states, the number of states being related to the number of memory elements of the encoder;
      ii a plurality of transitional branches; and
      iii a number of stages, the number of stages being related to the number of symbols in the modified bit stream;
   e. with respect to each stage of the trellis structure within the decision depth:
      i means for reading a symbol from the modified bit stream;
      ii with respect to each transitional branch in each state, means for computing a Hamming distance to the symbol and then an accumulated Hamming distance of a survivor path extended with the branch; and
      iii with respect to each state, means for determining a survivor path by comparing the accumulated Hamming distances for the survivor paths merging to the state;
   f. means for generating a preliminary output bit stream comprising a beginning and an end, the generating means comprising, with respect to each stage of the trellis structure outside the decision depth:
      i means for reading a symbol from the input bit stream;
      ii with respect to each transitional branch in each state, means for computing a Hamming distance to the symbol and then an accumulated Hamming distance of a survivor path extended with the branch;
      iii with respect to each state, means for determining a survivor path by comparing the accumulated Hamming distances for the survivor paths merging to the state; and
      iv means for deciding each decoded symbol of the input bit stream using majority logic;
   g. means for deriving a truncated preliminary output bit stream comprising a beginning and an end by:
      i discarding from the beginning of the preliminary output bit stream a number of bits related to the stabilization depth; and
      ii discarding from the end of the preliminary output bit stream a number of bits related to the decision depth; and
   h. means for deriving an output bit stream by reorganizing the truncated preliminary output bit stream by moving bits between the beginning and end of the truncated output bit stream in accordance with the relative number of bits in the stabilization depth and in the segment of the input bit stream repeated.

10. An apparatus as defined in claim 9, wherein the means for deciding each symbol of the input bit stream using majority logic further comprises means for eliminating states having relatively high Hamming distances, thereby removing such states from the decision making process.

11. An apparatus as defined in claim 9, wherein the input bit stream has a beginning and an end, and wherein the segment of the input bit stream is located at the beginning of the input bit stream, and wherein the segment is repeated at the end of the input bit stream.

12. An apparatus as defined in claim 9, wherein the input bit stream has a beginning and an end, and wherein the segment of the input bit stream is located at the end of the input bit stream, and wherein the segment is repeated at the beginning of the input bit stream.

13. An apparatus as defined in claim 9, wherein the input bit stream has a beginning and an end, and wherein there is a beginning segment located at the beginning of the input bit stream and an end segment located at the end of the input bit stream, and wherein the beginning segment is repeated at the end of the input bit stream and the end segment is repeated at the beginning of the input bit stream.

14. An apparatus as defined in claim 9, wherein the means for assuming an initial accumulated Hamming distance for each possible initial state of the encoder assumes the probability for each possible initial state of the encoder to be equal.

15. An apparatus as defined in claim 9, wherein the means for assuming an initial accumulated Hamming distance for each possible initial state of the encoder assumes the initial state of the encoder to be set randomly.

16. An apparatus as defined in claim 9, wherein the means for assuming an initial accumulated Hamming distance for each possible initial state of the encoder assumes the initial state of the encoder to be the final state from a previous frame.

17. Computer executable software code stored on a computer readable medium, the code for hard-decision channel decoding of tail-biting convolutional codes, the code comprising:
  a. code to receive from a channel an input bit stream encoded by a tail-biting convolutional channel encoder, the encoder comprising a number of memory elements and having a rate, the input bit stream comprising a series of symbols, each symbol comprising a number of bits, the number of bits being related to the rate of the encoder;
  b. code to generate a modified bit stream comprising a number of symbols by repeating a segment of the input bit stream, the segment comprising a number of symbols equal to the sum of a decision depth and a stabilization depth;
  c. code to assume an initial accumulated Hamming distance for each possible initial state of the encoder;
  d. code to set a stage position to a first stage of a trellis structure corresponding to the encoder, the trellis structure representing:
    i. a number of states, the number of states being related to the number of memory elements of the encoder;
    ii. a plurality of transitional branches; and
    iii. a number of stages, the number of stages being related to the number of symbols in the modified bit stream;
  e. with respect to each stage of the trellis structure within the decision depth:
    i. code to read a symbol from the modified bit stream;
    ii. with respect to each transitional branch in each state, code to compute a Hamming distance to the symbol and then an accumulated Hamming distance of a survivor path extended with the branch; and
    iii. with respect to each state, code to determine a survivor path by comparing the accumulated Hamming distances for the survivor paths merging to the state;
  f. code to generate a preliminary output bit stream comprising a beginning and an end, the code to generate a preliminary output bit stream comprising, with respect to each stage of the trellis structure outside the decision depth:
    i. code to read a symbol from the modified bit stream;
    ii. with respect to each transitional branch in each state, code to compute a Hamming distance to the symbol and then an accumulated Hamming distance of a survivor path extended with the branch;
    iii. with respect to each state, code to determine a survivor path by comparing the accumulated Hamming distances for the survivor paths merging to the state; and
    iv. code to decide each decoded symbol of the modified bit stream using majority logic;
  g. code to derive a truncated preliminary output bit stream comprising a beginning and an end by:
    i. discarding from the beginning of the preliminary output bit stream a number of bits related to the stabilization depth; and
    ii. discarding from the end of the preliminary output bit stream a number of bits related to the decision depth; and
  h. code to derive an output bit stream by reorganizing the truncated preliminary output bit stream by moving bits between the beginning and end of the truncated output bit stream in accordance with the relative number of bits in the stabilization depth and in the segment of the input bit stream repeated.

18. A programmed computer for hard-decision channel decoding of tail-biting convolutional codes, comprising
  a. a memory having at least one region for storing computer executable program code; and
  b. a processor for executing the program code stored in the memory;
  c. wherein the program code includes:
    i. code to receive from a channel an input bit stream encoded by a tail-biting convolutional channel encoder, the encoder comprising a number of memory elements and having a rate, the input bit stream comprising a series of symbols, each symbol comprising a number of bits, the number of bits being related to the rate of the encoder;
    ii. code to generate a modified bit stream comprising a number of symbols by repeating a segment of the input bit stream, the segment comprising a number of symbols, the number of symbols being equal to the sum of a decision depth and a stabilization depth;
    iii. code to assume an initial accumulated Hamming distance for each possible initial state of the encoder;
    iv. code to set a stage position to a first stage of a trellis structure corresponding to the encoder, the trellis structure representing:
      (1) a number of states, the number of states being related to the number of memory elements of the encoder;
      (2) a plurality of transitional branches; and
      (3) a number of stages, the number of stages being related to the number of symbols in the modified bit stream;
    v. with respect to each stage of the trellis structure within the decision depth:
      (1) code to read a symbol from the modified bit stream;
      (2) with respect to each transitional branch in each state, code to compute a Hamming distance to the symbol and then an accumulated Hamming distance of a survivor path extended with the branch; and
      (3) with respect to each state, code to determine a survivor path by comparing the accumulated Hamming distances for the survivor paths merging to the state;
    vi. code to generate a preliminary output bit stream comprising a beginning and an end, the code to generate a preliminary output bit stream comprising, with respect to each stage of the trellis structure outside the decision depth:
      (1) code to read a symbol from the modified bit stream;

(2) with respect to each transitional branch in each state, code to compute a Hamming distance to the symbol and then an accumulated Hamming distance of a survivor path extended with the branch;

(3) with respect to each state, code to determine a survivor path by comparing the accumulated Hamming distances for the survivor paths merging to the state; and (4) code to decide each decoded symbol of the modified bit stream using majority logic;

vii. code to derive a truncated preliminary output bit stream comprising a beginning and an end by:
(1) discarding from the beginning of the preliminary output bit stream a number of bits related to the stabilization depth; and
(2) discarding from the end of the preliminary output bit stream a number of bits related to the decision depth; and viii. code to derive an output bit stream by reorganizing the truncated preliminary output bit stream by moving bits between the beginning and end of the truncated output bit stream in accordance with the relative number of bits in the stabilization depth and in the segment of the input bit stream repeated.

19. A computer readable medium having computer executable software code stored thereon, the code for hard-decision channel decoding of tail-biting convolutional codes, comprising:

a. code to receive from a channel an input bit stream encoded by a tail-biting convolutional channel encoder, the encoder comprising a number of memory elements and having a rate, the input bit stream comprising a series of symbols, each symbol comprising a number of bits, the number of bits being related to the rate of the encoder;

b. code to generate a modified bit stream comprising a number of symbols by repeating a segment of the input bit stream, the segment comprising a number of symbols, the number of symbols being equal to the sum of a decision depth and a stabilization depth;

c. code to assume an initial accumulated Hamming distance for each possible initial state of the encoder;

d. code to set a stage position to a first stage of a trellis structure corresponding to the encoder, the trellis structure representing:
  i. a number of states, the number of states being related to the number of memory elements of the encoder;
  ii. a plurality of transitional branches; and
  iii. a number of stages, the number of stages being related to the number of symbols in the modified bit stream;

e. with respect to each stage of the trellis structure within the decision depth:
  i. code to read a symbol from the modified bit stream;
  ii. with respect to each transitional branch in each state, code to compute a Hamming distance to the symbol and then an accumulated Hamming distance of a survivor path extended with the branch; and
  iii. with respect to each state, code to determine a survivor path by comparing the accumulated Hamming distances for the survivor paths merging to the state;

f. code to generate a preliminary output bit stream comprising a beginning and an end, the code to generate a preliminary output bit stream comprising, with respect to each stage of the trellis structure outside the decision depth:
  i. code to read a symbol from the modified bit stream;
  ii. with respect to each transitional branch in each state, code to compute a Hamming distance to the symbol and then an accumulated Hamming distance of a survivor path extended with the branch;
  iii. with respect to each state, code to determine a survivor path by comparing the accumulated Hamming distances for the survivor paths merging to the state; and
  iv. code to decide each decoded symbol of the modified bit stream using majority logic;

g. code to derive a truncated preliminary output bit stream comprising a beginning and an end by:
  i. discarding from the beginning of the preliminary output bit stream a number of bits related to the stabilization depth; and
  ii. discarding from the end of the preliminary output bit stream a number of bits related to the decision depth; and h. code to derive an output bit stream by reorganizing the truncated preliminary output bit stream by moving bits between the beginning and end of the truncated output bit stream in accordance with the relative number of bits in the stabilization depth and in the segment of the input bit stream repeated.

20. A computer data signal embodied in a carrier wave comprising, for hard-decision channel decoding of tail-biting convolutional codes:

a. code to receive from a channel an input bit stream encoded by a tail-biting convolutional channel encoder, the encoder comprising a number of memory elements and having a rate, the input bit stream comprising a series of symbols, each symbol comprising a number of bits, the number of bits being related to the rate of the encoder;

b. code to generate a modified bit stream comprising a number of symbols by repeating a segment of the input bit stream, the segment comprising a number of symbols, the number of symbols being equal to the sum of a decision depth c. code to assume an initial accumulated Hamming distance for each possible initial state of the encoder;

d. code to consider a trellis structure corresponding to the encoder, the trellis structure representing:
  i. a number of states, the number of stages being related to the number of memory elements of the encoder;
  ii. a plurality of transitional branches; and
  iii. a number of stages, the number of stages being related to the number of symbols in the modified bit stream;

e. with respect to each stage of the trellis structure within the decision depth:
  i. code to read a symbol from the modified bit stream;
  ii. with respect to each transitional branch in each state, code to compute a Hamming distance to the symbol and then an accumulated Hamming distance of a survivor path extended with the branch; and
  iii. with respect to each state, code to determine a survivor path by comparing the accumulated Hamming distances for the survivor paths merging to the state;

f. code to generate a preliminary output bit stream comprising a beginning and an end, the code to generate a preliminary output bit stream comprising, with respect to each stage of the trellis structure outside the decision depth:
  i. code to read a symbol from the modified bit stream;
  ii. with respect to each transitional branch in each state, code to compute a Hamming distance to the symbol and then an accumulated Hamming distance of a survivor path extended with the branch;

iii. with respect to each state, code to determine a survivor path by comparing the accumulated Hamming distances for the survivor paths merging to the state; and iv. code to decide each decoded symbol of the modified bit stream using majority logic;

g. code to derive a truncated preliminary output bit stream comprising a beginning and an end by:
  i. discarding from the beginning of the preliminary output bit stream a number of bits related to the stabilization depth; and
  ii. discarding from the end of the preliminary output bit stream a number of bits related to the decision depth; and h. code to derive an output bit stream by reorganizing the truncated preliminary output bit stream by moving bits between the beginning and end of the truncated output bit stream in accordance with the relative number of bits in the stabilization depth and in the segment of the input bit stream repeated.

21. An apparatus for hard-decision channel decoding of tail-biting convolutional codes, the apparatus comprising:

a. a first bit stream reader for receiving from a channel an input bit stream encoded by a tail-biting convolutional channel encoder, the encoder comprising a number of memory elements and having a rate, the input bit stream comprising a series of symbols, each symbol comprising a number of bits, the number of bits being related to the rate of the encoder;

b. an extender for generating a modified bit stream comprising a number of symbols by repeating a segment of the input bit stream, the segment comprising a number of symbols, the number of symbols being equal to the sum of a decision depth and a stabilization depth;

c. an initial state estimator for assuming an initial accumulated Hamming distance for each possible initial state of the encoder;

d. a trellis applicator for setting a stage position to a first stage of a trellis structure corresponding to the encoder, the trellis structure representing:
  i. a number of states, the number of stages being related to the number of memory elements of the encoder;
  ii. a plurality of transitional branches; and
  iii. a number of stages, the number of stages being related to the number of symbols in the modified bit stream;

e. with respect to each stage of the trellis structure within the decision depth:
  i. a second bit stream reader for reading a symbol from the modified bit stream;
  ii. with respect to each transitional branch in each state, a first metric calculator for computing a Hamming distance to the symbol and then an accumulated Hamming distance of a survivor path extended with the branch; and
  iii. with respect to each state, a first path determinator for determining a survivor path by comparing the accumulated Hamming distances for the survivor paths merging to the state;

f. a bit stream generator for generating a preliminary output bit stream comprising a beginning and an end, the bit stream generator comprising, with respect to each stage of the trellis structure outside the decision depth:
  i. a third bit stream reader for reading a symbol from the input bit stream;
  ii. with respect to each transitional branch in each state, a second metric calculator for computing a Hamming distance to the symbol and then an accumulated Hamming distance of a survivor path extended with the branch;
  iii. with respect to each state, a second path determinator for determining a survivor path by comparing the accumulated Hamming distances for the survivor paths merging to the state; and
  iv. a decider for deciding each decoded symbol of the input bit stream using majority logic;

g. a bit stream truncator for deriving a truncated preliminary output bit stream comprising a beginning and an end by:
  i. discarding from the beginning of the preliminary output bit stream a number of bits related to the stabilization depth; and
  ii. discarding from the end of the preliminary output bit stream a number of bits related to the decision depth; and h. a bit stream deriver for deriving an output bit stream by reorganizing the truncated preliminary output bit stream by moving bits between the beginning and end of the truncated output bit stream in accordance with the relative number of bits in the stabilization depth and in the segment of the input bit stream repeated.

* * * * *